United States Patent [19]
Kobayashi et al.

[11] Patent Number: 5,479,374
[45] Date of Patent: Dec. 26, 1995

[54] SEMICONDUCTOR MEMORY DEVICE EMPLOYING SENSE AMPLIFIER CONTROL CIRCUIT AND WORD LINE CONTROL CIRCUIT

[75] Inventors: Tsuguo Kobayashi, Setagaya; Tsukasa Shirotori, Yokohama, both of Japan; Kazutaka Nogami, Palo Alto, Calif.

[73] Assignee: Kabushiki Kaisha Toshiba, Kanagawa, Japan

[21] Appl. No.: 279,684

[22] Filed: Jul. 25, 1994

Related U.S. Application Data

[62] Division of Ser. No. 68,422, May 27, 1993, abandoned.

[30] Foreign Application Priority Data

May 27, 1992 [JP] Japan ...................... 5-135306

[51] Int. Cl.⁶ .................................... G11C 7/00
[52] U.S. Cl. ................ 365/233.5; 365/202; 365/203; 365/190; 365/207; 365/227
[58] Field of Search ................. 365/233.5, 233, 365/202, 203, 154, 156, 190, 205, 206, 207, 226, 227, 189.05, 230.03; 307/530; 327/51

[56] References Cited

U.S. PATENT DOCUMENTS

| | | |
|---|---|---|
| 4,922,461 | 5/1990 | Hayakawa et al. ............ 365/230.08 |
| 4,947,379 | 8/1990 | Okuyama ...................... 365/233.5 |
| 4,972,374 | 11/1990 | Wang et al. ..................... 365/205 |
| 5,025,422 | 6/1991 | Moriwaki et al. ............. 365/233.5 |
| 5,193,076 | 3/1993 | Houston ......................... 365/233.5 |
| 5,214,610 | 5/1993 | Houston ......................... 365/233.5 |
| 5,228,003 | 7/1993 | Tokuda .......................... 365/233.5 |
| 5,327,394 | 7/1994 | Green et al. ................... 365/233.5 |
| 5,343,432 | 8/1994 | Matsuo et al. ................. 365/203 |

OTHER PUBLICATIONS

Minato, Osamu, et al. "Session XV: Static RAMs THPM 15.5: A 20ns 64K CMOS SRAM" ISCC Digest of Technical Papers, pp. 222–223, Feb. 23, 1984.

Matsui Masataka, et al., "Two Power–Down Circuits on the 1Mb CMOS SRAM" Proc. Symp. VLSI Circ. (Tokyo), Aug. 1988, pp. 55–56.

*Primary Examiner*—David C. Nelms
*Assistant Examiner*—Andrew Q. Tran
*Attorney, Agent, or Firm*—Loeb and Loeb

[57] ABSTRACT

A semiconductor memory device capable of reducing power consumption has a memory cell array, a plurality of address lines, a pair of data lines, an address transition detector circuit for outputting an address transition signal in response to a change in a signal on the address line, a sense amplifier, a sense amplifier control circuit for activating the sense amplifier in response to the address transition signal and deactivating the sense amplifier in response to the sense amplifier output signal, and a word line control circuit which deactivates the word lines within the memory cell array in response to the sense amplifier control circuit.

7 Claims, 10 Drawing Sheets

FIG. 7A  ADD 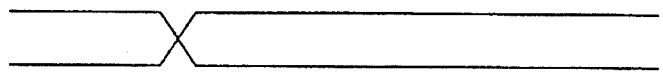
FIG. 7B  WORD LINE 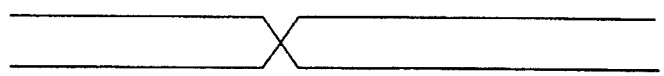
FIG. 7C  $\overline{\phi EQ}$ 
FIG. 7D  $\phi TR$ 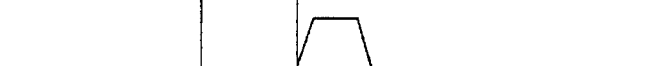
FIG. 7E  ACT 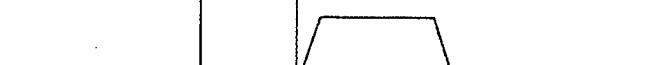
FIG. 7F  SO, $\overline{SO}$ 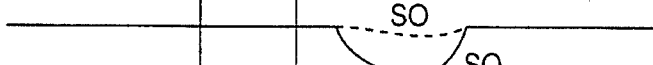
FIG. 7G  BUS, $\overline{BUS}$ 
FIG. 7H  DL, $\overline{DL}$ 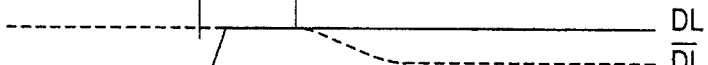

SEMICONDUCTOR MEMORY DEVICE EMPLOYING SENSE AMPLIFIER CONTROL CIRCUIT AND WORD LINE CONTROL CIRCUIT

This is a division of application Ser. No. 08/068,422 filed May 27, 1993, now abandoned.

BACKGROUND OF THE INVENTION

1. Field of the Invention

The present invention relates to a semiconductor memory device provided with a sense amplifier.

2. Description of the Prior Art

A conventional semiconductor memory device provided with a sense amplifiers will be described hereinbelow with reference to FIGS. 1 and 2.

FIG. 1 ia a schematic block diagram showing an example of the conventional semiconductor memory device of a sense amplifier. In the drawing, an address signal Add inputted to the semiconductor memory device is converted into a control signal by a decode circuit 71. On the basis of the control signal, a memory cell in a memory cell array 72 can be selected. One of a pair of transistors of the selected memory cell outputs stored information to a data line DL, and the other thereof outputs the stored information to a data line /DL (the symbol / denotes inverted logic). The outputted stored information is inputted to an equalizer circuit 73 and a sense amplifier 74 via these data lines DL and /DL.

On the other hand, the above-mentioned address signal Add is also inputted to an address transition detector circuit 88. This address transition detector circuit 88 detects whether the value of the inputted address Add transits or not, and outputs an equalize control pulse $\Phi_{EQ}$ to the equalizer circuit 73 when the value of the address signal Add transits (i.e., a new address has been designated).

In response to the equalize control pulse $\Phi_{EQ}$ from the address transition detector circuit 88, the equalizer circuit 73 sets the voltage levels of the two data lines DL and /DL to a predetermined level.

Furthermore, being delayed by a delay circuit 86, the equalize control pulse $\Phi_{EQ}$ is given to the sense amplifier 74 as a sense amplifier activating signal ACT. When the sense amplifier activating signal ACT is turned on or active (i.e., at a "high" level), the sense amplifier 74 compares the potential of the line DL with that of the line /DL, and outputs a "low" level signal as an output SO and a "high" level signal as an output /SO if DL>/DL, respectively. In contrast with this, if DL</DL, the sense amplifier 74 outputs a "high" level signal as an output SO and a "low" level signal as an output /SO. Further, when the sense amplifier activating signal ACT is turned off or non-active, no signal is outputted.

These output data SO and /SO are outputted to two buses BUS and /BUS via a buffer 75, respectively, and further outputted to the external circuit through an output buffer 76.

FIG. 2 is a practical circuit diagram showing an example of the sense amplifier 74, which is constructed by a circuit composed of two pMOS transistors 77 and 78 and two nMOS transistors 79 and 80, a circuit composed of two pMOS transistors 81 and 82 and two nMOS transistors 83 and 84, and an nMOS transistor 85. The sense amplifier 74 activating signal ACT is inputted to the gate of the nMOS transistor 85. In the conventional sense amplifier as described above, consumed current Ia always flows as long as the sense amplifier activating signal ACT is turned on.

In the conventional semiconductor memory device constructed as described above, in usual the sense amplifier activating signal ACT is kept turned on when the device is being operated. In other words, the sense amplifier 74 is maintained always under the activated condition.

In the case where the sense amplifier 74 is maintained under the activated condition, however, since current always flows through the sense amplifier 74, the current consumption inevitably increases.

The above-mentioned drawbacks have become serious more and more, with the recent technical progress of the semiconductor memory devices to larger capacitance and higher speed.

To overcome the above-mentioned problem, there has been proposed a semiconductor memory device which can reduce the current consumption Ia by reducing the time when the sense amplifier activating signal ACT is kept turned on.

In the semiconductor memory device as described above, however, it is necessary to provide a sufficient margin with respect to the time when the sense amplifier activating signal ACT is kept turned on. This is because the reliability of the operation must be secured, under due consideration of the setting error of the delay time determined by the delay circuit 86. The setting error may be produced by the dispersion caused during the manufacturing process or the modification or fluctuations of the operating conditions. Accordingly, when a high speed access is repeated continuously in a short cycle, the time when the sense amplifier activating signal ACT is kept turned off is very short, with the result that a sufficient effect may not be expected.

In addition, a relatively long wire is required to turn on the sense amplifier activating signal ACT according to locations for taking our signals, thus raising another problem in that the signal is delayed though the long wire.

Further, it may be possible to construct the buffer circuit by use of latch circuits in order to control the sense amplifier activating signal ACT on the basis of the output signal of the latch circuits. In this case, however, it is rather difficult to set the latch timing at high speed, with the result that the control operation is not easy in the case of the semiconductor memory device of asynchronization type.

Summary of the Invention

Accordingly, the object of the present invention is to provide a semiconductor memory device which can sufficiently reduce the current consumption, even when the device is operated at high speed or the manufacturing dispersion exists.

According to the present invention, there is provided a semiconductor memory device, comprising:

a memory cell array for storing information;

a pair of data lines for acquiring complementary data from the memory cell;

address transition detecting means for detecting transition in address for designating a memory cell in or from which data is written or read and for outputting an address transition detection signal;

equalizing means for equalizing potential of a pair of the data lines to a predetermined same value on the basis of said address transition detection signal;

a sense amplifier for outputting memory data on the basis of change in potential due to memory cell data on a pair of the data lines equalized by said equalizing means; and a sense amplifier control circuit for activating said sense amplifier on the basis of said address transition detection signal and deactivating said sense amplifier when two outputs of said sense amplifier taken out from vicinity of said sense amplifier do not match in level each other.

More specifically, to achieve the above-mentioned object, the semiconductor memory device according to the present invention is provided for a sense amplifier control circuit for activating the sense amplifier on the basis of address transition detected by an address transition detecting circuit and deactivating the sense amplifier on the basis of the complementary sense amplifier outputs taken out from the vicinity of the sense amplifier.

In the semiconductor memory device according to the present invention, it is possible to reduce the current consumption sufficiently even if the device is operated at a high speed and further when the manufacturing dispersion is relatively large, thus enabling a high reliable semiconductor memory device.

BRIEF DESCRIPTION OF THE DRAWINGS

In the attached drawings:

FIGS. 7A to 7H are timing charts for assistance in explaining the operation of the semiconductor memory device shown in FIG. 3;

DETAILED DESCRIPTION OF THE PREFERRED EMBODIMENTS

The embodiments of the present invention will be described hereinbelow with reference to the attached drawings.

Figure 3:
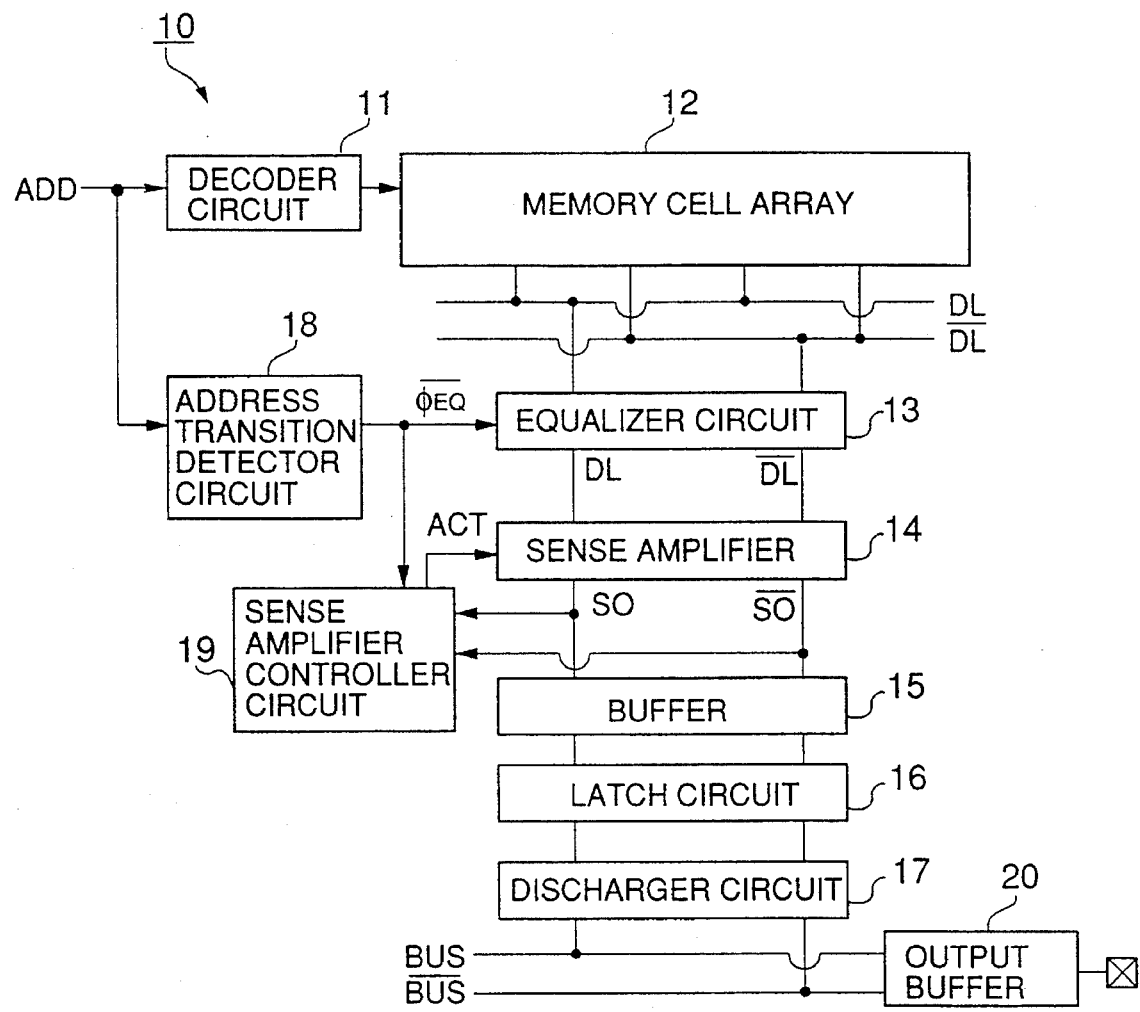
FIG. 3 is a schematic block diagram showing a first embodiment of the semiconductor memory device according to the present invention.

FIG. 3 is a schematic block diagram showing the first embodiment of the semiconductor memory device according to the present invention.

An address signal Add inputted to a semiconductor memory device 10 is applied to a decode circuit 11 and an address transition detecting circuit 18, respectively.

The decode circuit 11 selects a word line and a bit line (both not shown) of a memory cell array 12 in accordance with the inputted address signal Add.

The memory cell array 12 is provided with a plurality of memory cells arranged in a matrix forms. In the present invention, one memory cell can be selected by the combination of the above-mentioned word line and the bit line. In a pair of transistors of the selected memory cell, one transistor outputs a stored information to a data line DL, and the other transistor outputs the stored information to a data line /DL.

The address transition detecting circuit 18 detects whether the value of the inputted address Add transits or not, and outputs an equalize control pulse $\Phi_{EQ}$ to an equalizer circuit 13 when the value of the address signal Add transits (i.e., a new address has been designated).

In response to the equalize control pulse $\Phi_{EQ}$ from the address transition detecting circuit 18, the equalizer circuit 13 sets the voltage level of the two data lines DL and /DL to a predetermined level.

When a sense amplifier activating signal ACT is turned on or active (i,e., at the "high" level), the sense amplifier 14 compares the potential of the line DL with that of the line /DL, and outputs a "low" level signal as an output SO and a "high" level signal as an output /SO if DL>/DL, respectively. In contrast with this, if DL</DL, the sense amplifier 14 outputs a "high" level signal as an output SO and a "low" level signal as an output /SO. Further, the circuit configuration of the sense amplifier 14 is the same as that of the conventional sense amplifier 74 as shown in FIG. 2.

Figure 2:
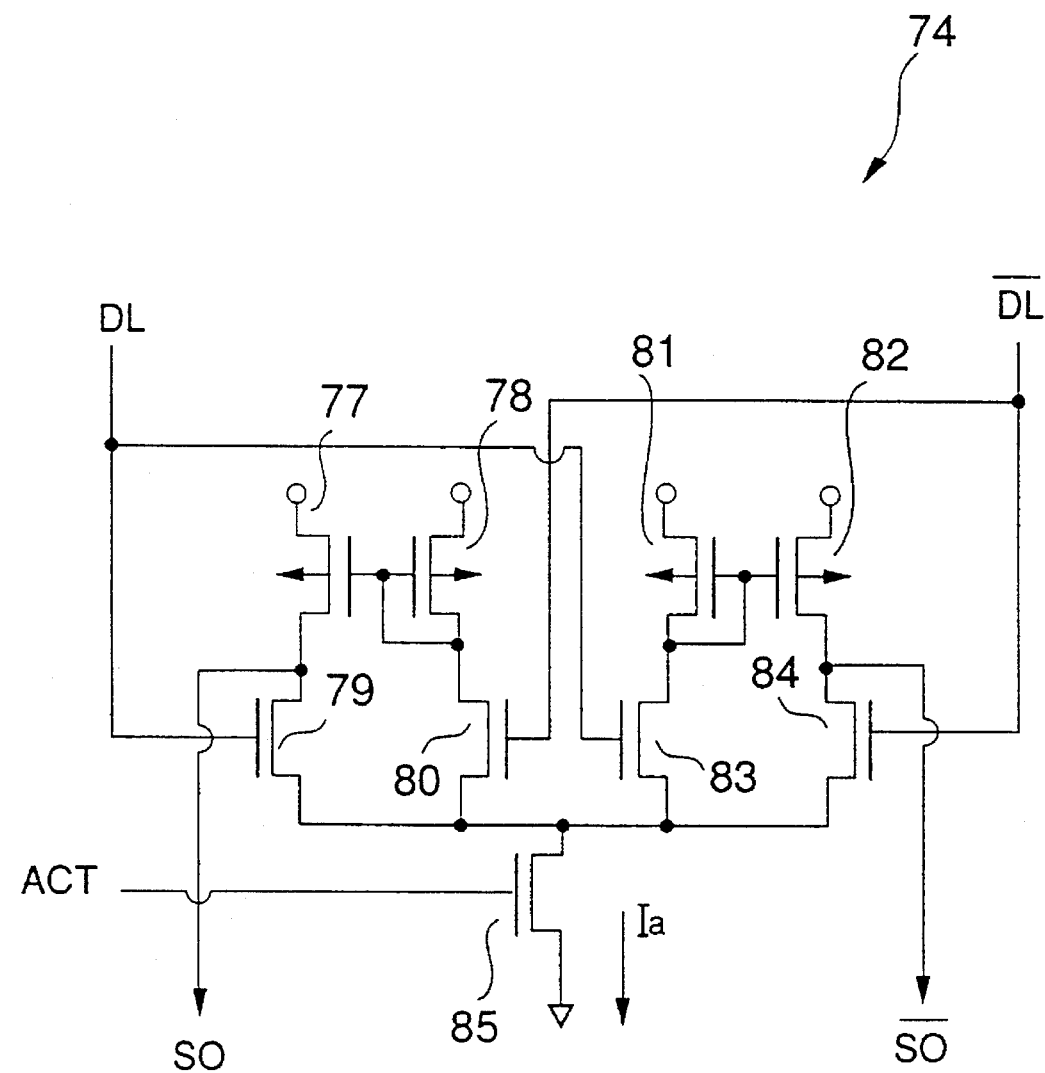
FIG. 2 is a practical circuit diagram showing an example of prior art sense amplifier.

In the sense amplifier as shown in FIG. 2, when the capacitance at the node SO or /SO is large, the operation speed is deteriorated. To overcome this problem, it is possible to provide an inverter between the respective drains of the pMOS transistors 77 and 78 and the output SO and /SO, respectively.

As described later, a sense amplifier control circuit 19 receives the equalize control pulse /$\Phi_{EQ}$ and the outputs SO and /SO of the sense amplifier 14, and turns on or off a sense amplifier activating signal ATC on the basis of these signals, so that the activation and deactivation of the sense amplifier 14 can be controlled.

In controlling the sense amplifier 14, it is preferable to dispose the sense amplifier control circuit 19 in the vicinity of the sense amplifier 14 and further to acquire the sense amplifier outputs SO and /SO from a position of the sense amplifier 14 as close as possible to the sense amplifier control circuit 19, so that the sense amplifier outputs are not susceptible to the length of the signal path.

The memory data outputted from the outputs SO and /SO of the sense amplifier 14 are also inputted to a latch circuit 16 through a buffer 15, respectively. The latch circuit 16 latches the inputted memory data, and further outputs the latched data to buses BUS and /BUS, respectively. A discharger circuit 17 is used to fix the signal level of the buses BUS and /BUS at a low level, before the semiconductor memory device is operated. The signal on the buses BUS and /BUS are outputted to the outside via an output buffer 20.

Further, in FIG. 3, only one of pairs of the data lines DL and /DL, the equalize circuits 13, the sense amplifiers 14, the buffers 15, the latch circuits 16 and the discharger circuits 17 are shown respectively. In this embodiment, in practice, these composing elements DL, /DL, 13 to 17 are provided one by one for each of a plurality of bit lines (not shown), respectively. These plural equalize circuits 13 and the sense amplifiers 14 are controlled by one address change detecting circuit 18 and one sense amplifier control circuit 19, respectively. To the sense amplifier control circuit 19, the outputs SO and /SO of only one of a plurality of the sense amplifiers 14 are connected. In this case, it is preferable to use a sense amplifier 14 whose response speed is the latest (the sense amplifier arranged farthest away from the decode circuit 11), as the sense amplifier 14 for controlling the sense amplifier control circuit 19.

Figure 4:
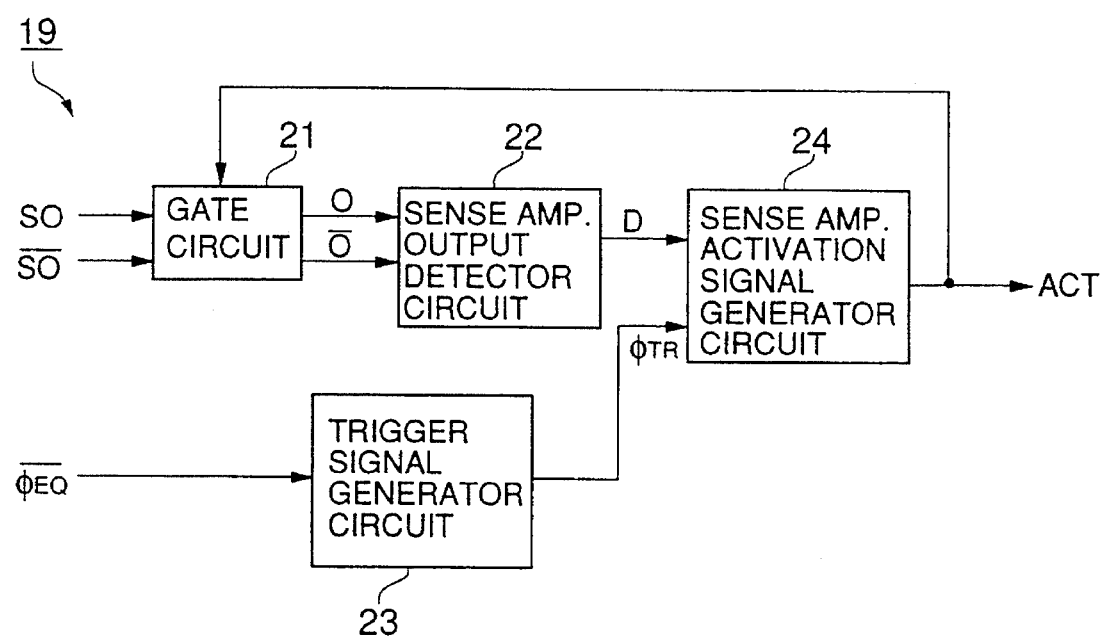
FIG. 4 is a schematic block diagram showing the sense amplifier control circuit shown in FIG. 3.

The circuit configuration of the sense amplifier control circuit 19 will be described in detail hereinbelow with reference to FIG. 4. FIG. 4 is a schematic block diagram showing the sense amplifier control circuit 19.

A gate circuit 21 receives the sense amplifier activating signal ACT from a sense amplifier activating signal forming circuit 24 (described later). If the sense amplifier activating signal ACT is on or active (e.g., at the "high" level in this embodiment), the gate circuit 21 outputs two output data SO and /SO as they are as the outputs O and /O. Further, if the sense amplifier activating signal ACT is off or non-active (e.g., at the "low" level in this embodiment), the gate circuit 21 outputs two output data of the same level as the outputs O and /O. In other words, the outputs O and /O become both the "high" or "low" level.

A sense amplifier output detecting circuit 22 acquires the output data O and /O of the gate circuit 21, and compares these two acquired data. After the sense amplifier activating signal ACT has turned on an nMOS transistor 30 (shown in FIG. 5) of the sense amplifier output detecting circuit 22, when both data O and /O matches each other (data are both at the "high" level in FIG. 5, as described later), the output signal D of the sense amplifier output detecting circuit 22 is turned on (at the "low" level in this embodiment). Further, if both do not match, the output signal D of the sense amplifier output detecting circuit 22 is turned off (at the "high" level in this embodiment).

A trigger signal forming circuit 23 receives an equalize signal $/\Phi_{EQ}$ from the address transition detecting circuit 18 (shown in FIG. 3), and delays the equalize signal $/\Phi_{EQ}$ by a predetermined timing, before outputting it as a trigger pulse $\Phi_{TR}$.

In response to the trigger pulse $\Phi_{TR}$ from the trigger signal forming circuit 23, a sense amplifier activating signal forming circuit 24 turns on the sense amplifier activating signal ACT. Further, when the signal D inputted by the sense amplifier output detecting circuit 22 changes from on to off, the sense amplifier activating signal forming circuit 24 turns off the sense amplifier activating signal ACT.

In this embodiment, the trigger signal forming circuit 23 forms the trigger pulse $\Phi_{TR}$ on the basis of the equalize control pulse $/\Phi_{EQ}$. Without being limited thereto, however, it is possible to form the trigger pulse $\Phi_{TR}$ by other methods. For instance, it is also possible to input the trigger pulse $\Phi_{TR}$ from an external circuit.

Figure 5:
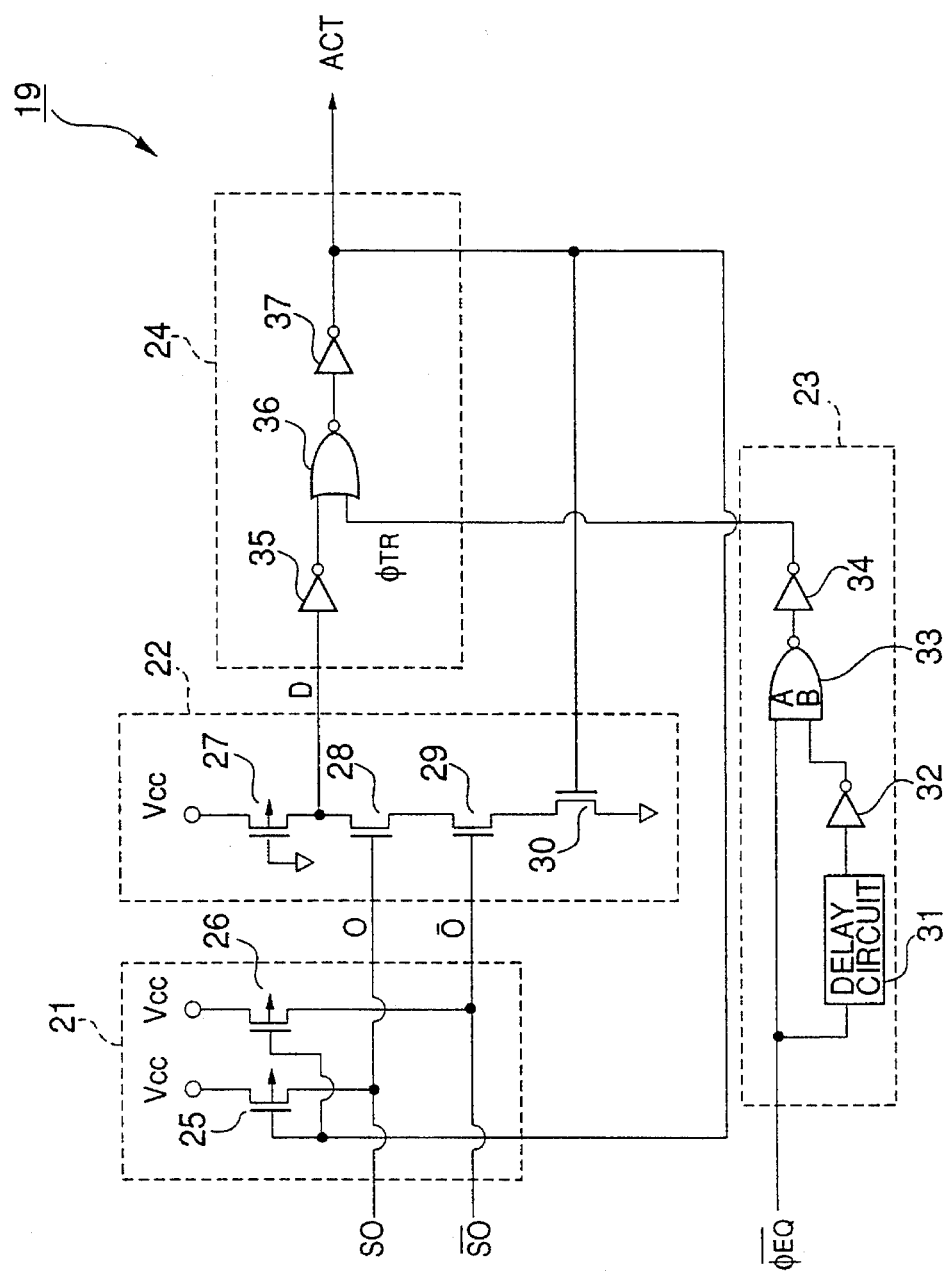
FIG. 5 is a practical circuit diagram showing an example of the sense amplifier control circuit shown in FIG. 4.

FIG. 5 is a practical circuit diagram showing an example of the sense amplifier control circuit 19, in which the same reference numerals have been retained for the similar elements which have the same functions as in FIG. 4.

The gate circuit 21 can be formed by two pMOS transistors 25 and 26. The sense amplifier activating signal ACT is inputted to the gates of these pMOS transistors 25 and 26, respectively. A supply voltage Vcc is supplied to the sources of these pMOS transistors 25 and 26, respectively. Further, the output SO is applied to the drain of the pMOS transistor 25 and the output /SO is applied to the drain of the pMOS transistor 26, respectively.

In the circuit configuration as described above, when the sense amplifier activating signal ACT is off (i.e., at the "low" signal level), since the pMOS transistors 25 and 26 are both turned on, the outputs O and /O of both are fixed at the "high" level. On the other hand, when the sense amplifier activating signal ACT is on (i.e., at the "high" signal level), since the pMOS transistors 25 and 26 are both turned off, the outputs SO and /SO of the sense amplifier are outputted as they are from the outputs O and /O.

Further, in the sense amplifier 74 as shown in FIG. 2, when the pMOS transistors 77, 78, 81 and 82 are replaced with nMOS transistors and further the supply voltage Vcc is replaced with the ground, the gate circuit 21 shown in FIG. 5 is to be formed by replacing the pMOS transistors 25 and 26 with nMOS transistors. In this gate circuit 21, when the sense amplifier activating signal ACT is off, the outputs O and /O are both fixed at the "low" level.

As shown in FIG. 5, the sense amplifier output detecting circuit 22 can be formed by a series-connected pMOS transistor 27 and nMOS transistors 28, 29 and 30. In this circuit, the channel width of this pMOS transistor 27 is narrower than that of the nMOS transistors 28, 29 and 30. The source of the transistor 27 is connected to the supply voltage Vcc and the gate thereof is grounded. Therefore, this pMOS transistor 27 is always turned on. Further, the drain of the pMOS transistor 27 is connected to the drain of the nMOS transistor 28 (this connection point is the output D of the sense amplifier output detecting circuit 22). The gate of the nMOS transistor 28 is connected to the output O of the gate circuit 21. The source of the nMOS transistor 28 is connected to the drain of the nMOS transistor 29. The gate of the nMOS transistor 29 is connected to the output /O of the gate circuit 21. The source of the nMOS transistor 29 is connected to the drain of the nMOS transistor 30. The sense amplifier activating signal ACT is inputted to the gate of the nMOS transistor 30. The source of the nMOS transistor 30 is grounded.

As described above, the sense amplifier output detecting circuit 22 shown in FIG. 5 constructs a NAND gate having three input terminals to which the outputs O and /O of the gate circuit 21 and the sense amplifier activating signal ACT are inputted, respectively. In other words, when the outputs O and /O and the sense amplifier activating signal ACT are all at the "high" level, since the respective nMOS transistors 27 to 30 are all turned on, the output D of the sense amplifier output detecting circuit 22 is grounded, so that the sense amplifier output detecting circuit 22 is set to the "low" level. On the other hand, when any one of the outputs O and /O and the sense amplifier activating signal ACT is at the "low" level, since at least one of the respective nMOS transistors 27 to 30 is turned off, the output D of the sense amplifier detecting circuit 22 is set to the "high" level. Further, the sense amplifier output detecting circuit 22 can be formed by a CMOS type NAND gate to which three input signals O, /O and ACT are inputted.

Further, as understood by the above-mentioned description, the sense amplifier output detecting circuit 22 shown in FIG. 5 can be used only when the gate circuit 21 is formed by pMOS transistors; that is, only when the gate circuit 21 is formed in such a way that the outputs O and /O of the gate circuit 21 (i.e., the signals inputted to the gates of the nMOS transistors 28 and 29) are at the "high" level when the sense amplifier activating signal ACT is off (i.e., at the "low" signal level).

On the other hand, where the gate circuit 21 is constructed in such a way that the outputs O and /O thereof are at the "low" level when the sense amplifier activating signal ACT is off (as when composed of nMOS transistors as above), the sense amplifier output detecting circuit 22 is constructed by an exclusive OR circuit, and the outputs O and /O of the gate circuit 21 are inputted to the input terminals of the exclusive OR circuit. Further, in this case, the sense amplifier output detecting circuit 22 can be used when the outputs O and /O of the gate circuit 21 are both at the "high" or "low" level under the condition that the sense amplifier activating signal ACT is off (i.e., at the "low" signal level).

However, it is preferable to use the NAND circuit as shown in FIG. 5 from the standpoint that the circuit scale can be reduced.

As shown in FIG. 5, the trigger signal forming circuit 23 is composed of a delay circuit 31, two NOT circuit 32 and 34, and a NAND circuit 33. The input of the delay circuit 31 is connected to the output of the address transition detecting circuit 18, so that an equalize control signal $/\Phi_{EQ}$ which is active in the "low" level can be inputted to the delay circuit 31. The input of the NOT circuit 32 is connected to the output of the delay circuit 31. One input terminal A of the NAND circuit 33 is directly connected to the output of the address transition detecting circuit 18, and the other input terminal B of the NOT circuit 33 is connected to the output terminal of the NOT circuit 32. Further, the output terminal of the NAND circuit 33 is connected to the input terminal of the NOT circuit 34, so that the inversion signal of the output of the NAND circuit 33 can be outputted as the trigger pulse $\Phi_{TR}$.

In the circuit configuration as described above, before the equalize control pulse $/\Phi_{TR}$ is inputted, since the input terminal of the trigger signal forming circuit 23 is at the "high" level, the "high" level signal is applied to the input terminal A of the NAND circuit 33 and the "low" level signal is applied to the other input terminal B thereof. Accordingly, the output of this NAND circuit 33 is at the "high" level, so that the output of the NOT circuit 34 (i.e., the output of the trigger signal forming circuit 23) is at the "low" level.

Here, if the equalize control signal $\Phi_{EQ}$ is inputted and further changes in level from the "low" level to the "high" level, the "high" level signal is applied to the input terminal A of the NAND circuit 33. On the other hand, before a delay time of the delay circuit 31 elapses, the input of the input terminal B is at the "high" level. Therefore, since the output of the NAND circuit 33 is at the "low" level, the trigger signal forming circuit 23 outputs the "high" level signal.

Under these conditions, after a delay time of the delay circuit 31 has elapsed, since the input of the input terminal B changes to the "low" level, the output of the NAND circuit 33 changes to the "high" level, so the trigger signal forming circuit 23 outputs the "low" level signal.

As described above, the trigger signal forming circuit 23 outputs a trigger pulse $\Phi_{TR}$ having a predetermined pulse width and delayed by the delay circuit 31, in response to the equalize control pulse $/\Phi_{EQ}$ from the address transition detector.

As shown in FIG. 5, the sense amplifier activating signal forming circuit 24 can be composed of two NOT circuits 35 and 37 and a NOR circuit 36. The input terminal of the NOT circuit 35 is connected to the output of the sense amplifier output detecting circuit 22. One input terminal of the NOR circuit 36 is connected to the output terminal of the NOT circuit 35, and the other input terminal thereof is connected to the output of the trigger signal forming circuit 23 (so that the trigger pulse $\Phi_{TR}$ can be inputted). The input terminal of the NOT circuit 37 is connected to the output terminal of the NOR circuit 36, so that the inversion signal of the output of the NOR circuit 36 can be outputted as the sense amplifier activating signal ACT.

Figure 6:
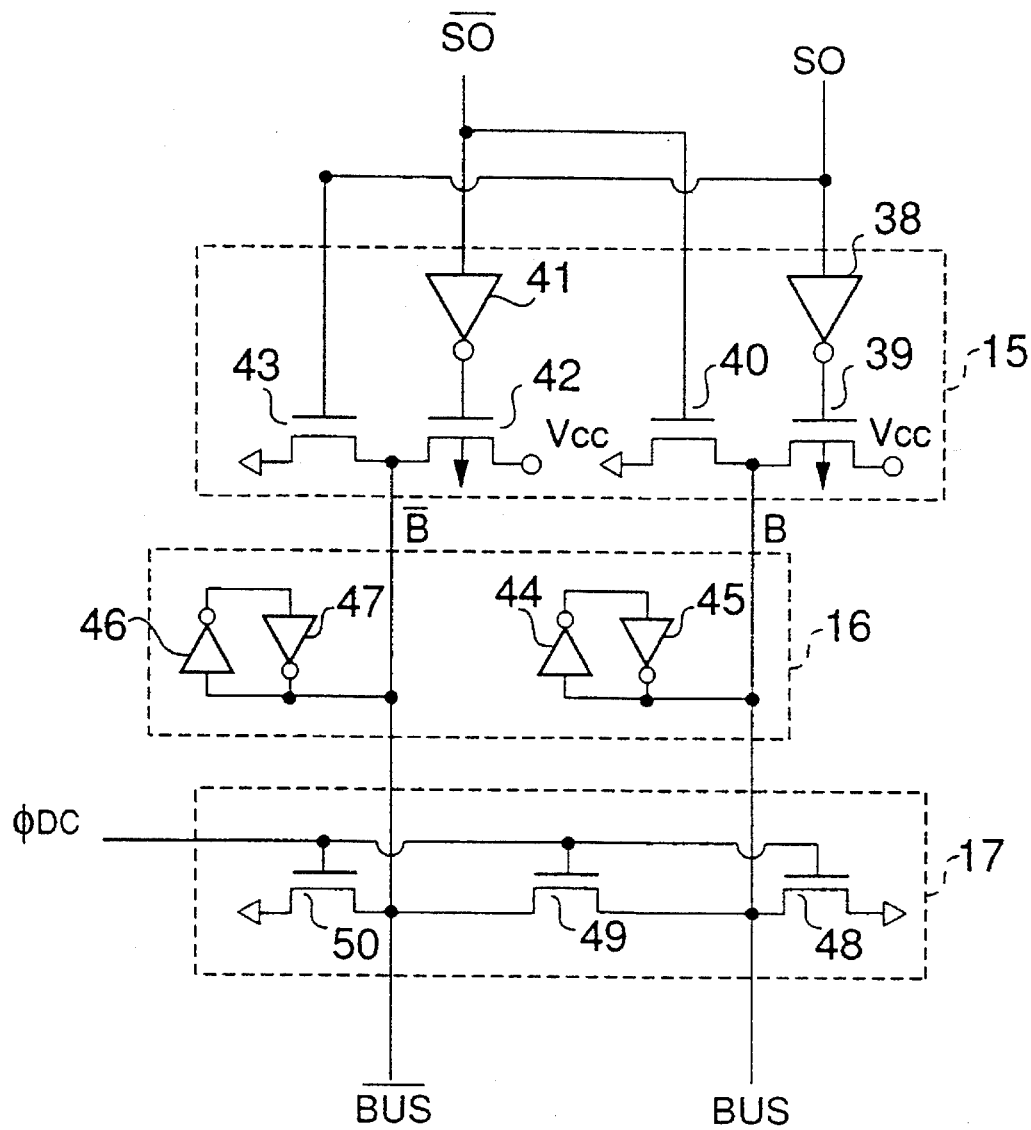
FIG. 6 is a practical circuit diagram showing an example of the buffer, latch and discharge circuits shown in FIG. 3.

FIG. 6 is a practical circuit diagram showing an example of the buffer circuit 15, the latch circuit 16 and the discharge circuit 17, respectively shown in FIG. 3.

As shown, the buffer circuit 15 is composed of two NOT circuits 38 and 41, two pMOS transistors 39 and 42, and two nMOS transistors 40 and 43. The output SO of the sense amplifier 14 is connected to the input terminal of the NOT circuit 38 and the output /SO thereof is connected to the input terminal of the NOT circuit 41, respectively. Further, the source of the pMOS transistor 39 is connected to a supply voltage Vcc, and the gate thereof is connected to the output terminal of the NOT circuit 38, respectively. The drain of the pMOS transistor 39 is connected to the drain of the nMOS transistor 40. The date of the nMOS transistor 40 is connected to the output /SO of the sense amplifier 14, and the source thereof is grounded. Here, the connection point between the drains of the pMOS transistor 39 and the nMOS transistor 40 is the output B of the buffer circuit 15.

Similarly, the source of the pMOS transistor 42 is connected to a supply voltage Vcc, and the gate thereof is connected to the output terminal of the NOT circuit 41, respectively. The drain of the pMOS transistor 42 is connected to the drain of the nMOS transistor 43. The gate of the nMOS transistor 43 is connected to the output SO of the sense amplifier 14, and the source thereof is grounded. Here, the connection point between the drains of the pMOS transistor 42 and the nMOS transistor 43 is the output /B of the buffer circuit 15.

In the circuit configuration as described above, when the output SO of the sense amplifier 14 is at the "high" level and the output /SO thereof is at the "low" level, since the gates of the pMOS transistor 39 and the nMOS transistor 40 are both at the "low" level, respectively, the pMOS transistor 39 is turned on and the nMOS transistor 40 is turned off, so that the output B is at the "high" level. At this time, since the gates of the pMOS transistor 42 and the nMOS transistor 43 are at the "high" level, respectively, the pMOS transistor 39 is turned off and the nMOS transistor 40 is turned on, so that the output /B is at the "low" level.

On the other hand, when the output SO of the sense amplifier 14 is at the "low" level and the output /SO is at the "high" level, the output /B is at the "high" level.

In other words, the inversion value of the output SO of the sense amplifier 14 is outputted as the output B of the buffer circuit 15, and the inversion value of the output /SO of the sense amplifier 14 is outputted as the output /B of the buffer circuit 15, respectively.

As shown in FIG. 6, the latch circuit 16 is composed of four NOT circuits 44 to 47. Here, the input terminal of the NOT circuit 44 is connected to the output B of the buffer circuit 15 and further to the output terminal of the NOT circuit 45. Further, the input terminal of the NOT circuit 45 is connected to the output terminal of the NOT circuit 44. In the same way, the input terminal of the NOT circuit 46 is connected to the output /B of the buffer circuit 15 and further to the output terminal of the NOT circuit 47. Further, the input terminal of the NOT circuit 47 is connected to the output terminal of the NOT circuit 46.

In the circuit configuration as described above, after the outputs B and /B of the buffer circuit 15 have been changed to a high impedance status, the latch circuit 16 latches the memory data until the succeeding equalization.

As shown in FIG. 6, the discharge circuit 17 is composed of three nMOS transistors 48 to 50. The drain of the nMOS transistor 48 is grounded. A discharge signal $\Phi_{DC}$ is inputted to the gate of the nMOS transistor 48. The source of the nMOS transistor 48 is connected to the drain of the nMOS transistor 49. A discharge signal $\Phi_{DC}$ is inputted to the gate of the nMOS transistor 49. The source of the nMOS transistor 49 is connected to the drain of the nMOS transistor 50. The source of the nMOS transistor 50 is grounded. A discharge signal $\Phi_{DC}$ is inputted to the gate of the nMOS transistor 50.

In the circuit configuration as described above, when the discharge signal $\Phi_{DC}$ is at the "low" level, the discharge circuit 17 outputs the output signal of the latch circuit 16 as they are to the buses BUS and /BUS, and when the discharge signal $\Phi_{DC}$ is at the "high" level, the discharge circuit 17 resets the output signal to the buses BUS and /BUD at the "row" level.

On the other hand, when the buses BUS and /BUS are required to be reset at the "high" level, the three nMOS transistors 48 to 50 are replaced with pMOS transistors.

Further, the latch circuit 16 and the discharge circuit 17 are not necessarily needed. Further, it is also possible to latch the outputs SO and /SO of the sense amplifier 14 by the latch circuit 16 and then to output the latched outputs to the buses BUS and /BUS via the buffer circuit 15.

The operation of the semiconductor memory device according to the present invention will be described hereinbelow with reference to the timing chart shown in FIGS. 7A to 7H.

First, when an address signal Add is inputted to the semiconductor memory device (as shown in FIG. 7A), the decode circuit 11 controls the on- or off-operation of the word lines and the bit lines (not shown) of the memory cell array in accordance with the address signal Add (as shown in FIG. 7B). Therefore, the memory cell array 12 outputs a memory information to the data lines DL and /DL.

At this time, the address transition detecting circuit 18 detects a transition in the address signal Add, and then outputs an equalize control pulse /$\Phi_{EQ}$ (as shown in FIG. 7C).

In synchronism with the equalize control pulse /$\Phi_{EQ}$ outputted from the address transition detecting circuit 18, the equalize circuit 13 sets the data lines DL and /DL to the same level (as shown in FIG. 7H). Further, the equalize control pulse /$\Phi_{EQ}$ is inputted to the sense amplifier control circuit 19.

Here, before the equalize control pulse /$\Phi_{EQ}$ is inputted to the sense amplifier control circuit 19, since the sense amplifier activating signal ACT outputted from the sense amplifier activating signal forming circuit 24 is off or nonactive (i.e., at the "low" level), the outputs of the gate circuit 21 shown in FIGS. 4 and 5 are fixed to the "high" level. That is, since both the outputs O and /O match each other in level, the output of the sense amplifier output detecting circuit 22 is at the "high" level.

Under these conditions, when the equalize control pulse $\Phi_{EQ}$ is inputted to the trigger signal forming circuit 23, the trigger signal forming circuit 23 outputs the trigger pulse $\Phi_{TR}$ (as shown in FIG. 7D).

When the trigger pulse $\Phi_{TR}$ is inputted to the sense amplifier activating signal forming circuit 24, since the output of the internal NAND circuit 36 is changed to the "low" level, the sense amplifier activating signal ACT becomes on or active (i.e., to the "high" level) (as shown in FIG. 7E). Further, under these conditions, the nMOS transistor 30 of the sense amplifier output detecting circuit 22 is turned on and thereby all the nMOS transistors 28, 29 and 30 are turned on, so that the output of the sense amplifier output detecting circuit 22 changes to the "low" level. Accordingly, the output of the NOT circuit 35 of the sense amplifier activating signal forming circuit 24 changes to the "high" level. Therefore, even if the trigger pulse $\Phi_{TR}$ changes to the "low" level, the sense amplifier activating signal ACT is kept on or active.

When the sense amplifier activating signal ACT becomes on or active, since the gate circuit 21 turns off the pMOS transistors 25 and 26, the gate circuit 21 outputs two outputs SO and /SO of the sense amplifier 14 as they are from the outputs O and /O thereof (as shown in FIG. 7F).

When the sense amplifier activating signal ACT is on or active, the sense amplifier 14 is activated in response to this signal ACT, so that the nMOS transistor 85 shown in FIG. 2 is turned on and thereby a consumed current Ia flows through the nMOS transistor 85. The sense amplifier 14 amplifies the memory information inputted through the data lines DL and /DL, and outputs the amplified memory data through the outputs SO and /SO (as shown in FIG. 7F).

The memory data outputted through the outputs SO and /SO of the sense amplifier 14 are transmitted to the sense amplifier control circuit 19.

The memory data transmitted to the buffer circuit 15 are latched by the latch circuit as already described, and then outputted to the buses BUS and /BUS, and further outputted to the outside through the output buffer 20.

On the other hand, the memory data transmitted to the sense amplifier control circuit 19 are passed through the gate circuit 21 as they are. Therefore, the outputs O and /O of the gate circuit 21 are different from each other. Accordingly, since the signal applied to the gate of one of the nMOS transistors 28 and 29 of the sense amplifier output detecting circuit 22 changes to the "low" level to turn off the nMOS transistor 28 or 29, so that the output of the sense amplifier control circuit 19 is at the "high" level. Therefore, the two input terminals of the NOR circuit 36 in the sense amplifier activating signal forming circuit 24 change to the "low" level (at this time, the trigger pulse $\Phi_{TR}$ has already been changed to the "low" level, as described above), so that the output of the NOR circuit 36 changes to the "high" level. As a result of this, the sense amplifier activating signal ACT becomes off or non-active (i.e., at the "low" level) (as shown in FIG. 7E).

Accordingly, since the outputs O and /O of the gate circuit 21 are fixed at the "high" level again, the nMOS transistors 28 and 29 of the sense amplifier output detecting circuit 22 are both turned on. In this case, however, since the nMOS transistor 30 is turned off, the output of the sense amplifier detecting circuit 22 is kept at the "high" level.

When the sense amplifier activating signal ACT changes to the "low" level, since the nMOS transistor 65 of the sense amplifier 14 is turned off, the sense amplifier 14 is deactivated, so that the consumed current Ia stops flowing.

As described above, in the semiconductor memory device according to the present invention, immediately after the memory data is outputted from the sense amplifier 14, the sense amplifier control circuit 19 detects the memory data and turns off the sense amplifier activating signal ACT. In other words, since the sense amplifier 14 is returned off into the non-active status immediately after the memory data has been outputted, it is possible to reduce sufficiently the time during which the consumed current Ia flows, even if the semiconductor memory device is operated at high speed.

Figure 1:
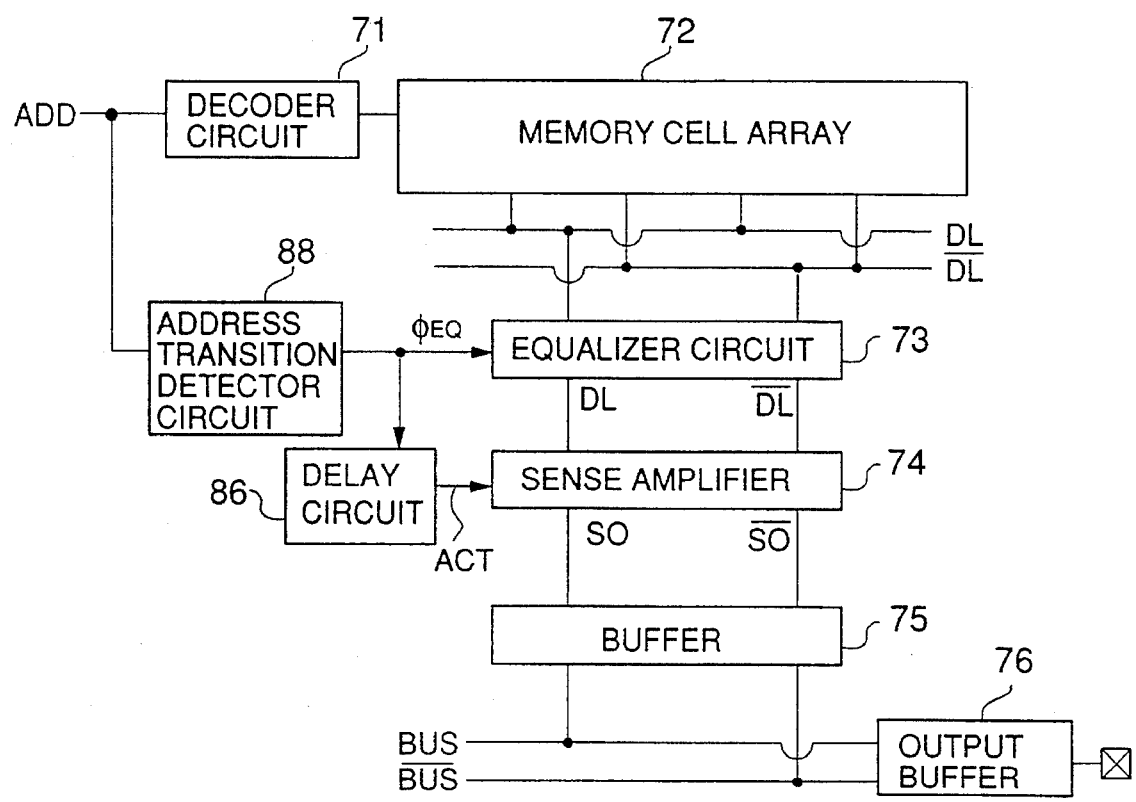
FIG. 1 is a schematic block diagram showing an example of prior art semiconductor memory device.

In addition, in the semiconductor memory device according to the present invention, the timing at which the sense amplifier activating signal ACT is turned off is determined by detecting the timing when the memory data is outputted from the sense amplifier 14 in the close vicinity of the sense amplifier, without determining the timing by a delay circuit as is the case of the conventional semiconductor memory device as shown in FIG. 1. Consequently, it is possible to provide the semiconductor memory device small in erroneous operation occurrence possibility and low in the current consumption, without being subjected to the influence of variation in manufacturing process and without providing a large margin for the timing at which the sense amplifier activating signal ACT is turned off.

Further, in the semiconductor memory device according to the present invention, in the case where a large current flows through the sense amplifier 14 beyond a designed value due to fluctuations during the manufacturing process, for instance, since the memory data can be read at an increasing speed with increasing current, it is possible to deactivate the sense amplifier 14 within a shorter time. In other words, even if the current value fluctuates, it is possible to determine the consumed current Ia to an averaged value; that is, the dispersion of the current consumption due to manufacturing process can be reduced.

A second embodiment of the present invention will be described hereinbelow. In this embodiment, the respective memory cells which constitute the above-mentioned memory cell array 12 as shown in FIG. 3 is divided into a plurality of memory cell blocks, and one sense amplifier control circuit 19 is provided for each memory cell block.

In this second embodiment, the semiconductor memory device is provided with a plurality of sets of the data lines DL and /DL, the equalize circuit 13, the sense amplifier 14, the latch circuit 16 and the discharge circuit 17 all the same way as with the case of the first embodiment. Each set is arranged for each memory cell block. Further, the sense amplifier control circuit 19 is also provided for each memory cell block. Each of the sense amplifier control circuits 19 acquires the outputs SO and /SO of the latest response sense amplifier 14 (arranged farthest away from the decode circuit 11 in the corresponding memory cell block) among a plurality of the sense amplifiers 14.

In the case where a plurality of memory cell blocks ape provided, only a single memory cell block is selected for activation, without activating all the memory cell blocks simultaneously. Therefore, a select signal for selecting the memory cell block is inputted to the sense amplifier control circuit 19 so that the sense amplifier control circuit 19 can be activated only when this select signal is on or active.

Figure 8:
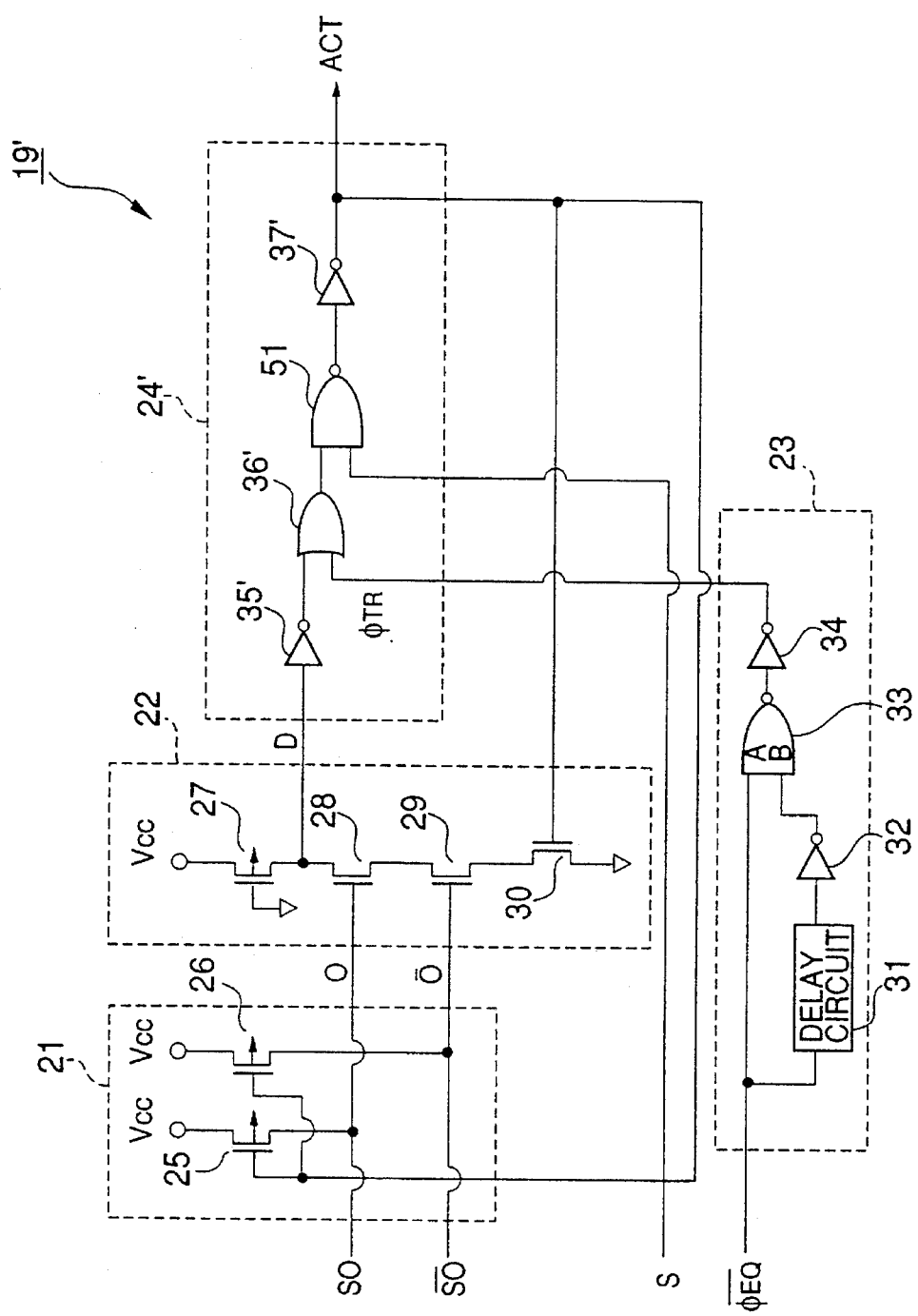
FIG. 8 is a schematic block diagram showing the sense amplifier control circuit of a second embodiment of the semiconductor memory device according to the present invention.

FIG. 8 shows an example of the sense amplifier control circuit so configured as to turn on the sense amplifier activating signal ACT only when the select signal A is on.

In this sense amplifier control circuit 19' shown in FIG. 8, the sense amplifier activating signal forming circuit 24' is different in configuration from that 24 of the first embodiment shown in FIG. 5. As shown, the sense amplifier activating signal forming circuit 24' is composed of two NOT circuits 35' and 37', an OR circuit 36', and an NAND circuit 51. Here, the input terminal of the NOT circuit 35' is connected to the output of the sense amplifier output detecting circuit 22'. One input terminal of the OR circuit 36' is connected to the output terminal of the NOT circuit 35', and the trigger pulse $\Phi_{TR}$ is inputted to the other input terminal thereof. One input terminal of the NAND circuit 51 is connected to the output terminal of the OR circuit 36', and the select signal S is inputted to the other input terminal thereof. Further, the input terminal of the NOT circuit 37' is connected to the output terminal of the NAND circuit 51. The inversion value of the output of the NAND circuit 51 is outputted as the sense amplifier activating signal ACT.

To minimize the signal delay, it also possible to combine the OR circuit 36' and the NAND circuit 51 as a composite gate (ORNAND).

In the circuit configuration as described above, the sense amplifier activating signal ACT is on or active, only when the select signal S is on or at the "high" level and the trigger pulse $\Phi_{TR}$ is inputted. In other words, in this embodiment, it is possible to apply the gist of the present invention to the semiconductor memory device whose memory cell array is controlled in unit of memory cell block, in spite of a simple circuit configuration.

A third embodiment of the present invention will be described hereinbelow.

In this embodiment, all the outputs SO and /SO of the respective sense amplifiers 14 are acquired by the sense amplifier control circuit, being different from the second embodiment in which only the outputs SO and /SO of the latest response sense amplifier 14 among a plurality of the sense amplifiers 14 are acquired by the sense amplifier control circuit 19'.

Figure 9:
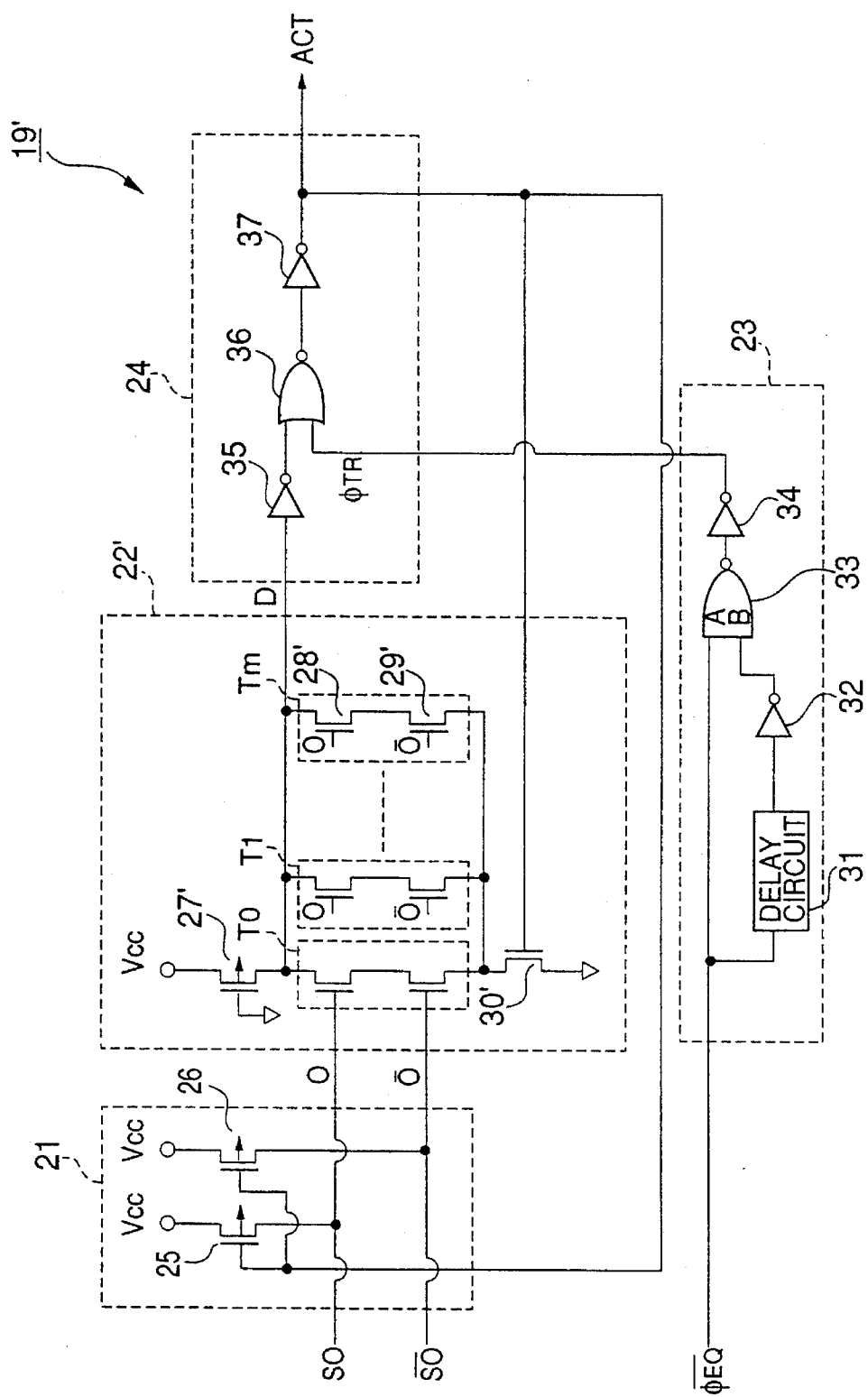
FIG. 9 is a schematic block diagram showing the sense amplifier control circuit of a third embodiment of the semiconductor memory device according to the present invention.

FIG. 9 shows an example of the circuit configuration of the sense amplifier control circuit as described above. In this sense amplifier control circuit 19", the gate circuit and the sense amplifier output detecting circuit are different from those of the first embodiment.

The gate circuits 21 whose number is the same as that of the sense amplifiers 14 are provided (only one is shown in FIG. 9), in order that each gate circuit 21 can acquire the outputs SO and /SO of the corresponding sense amplifier 14, respectively.

The sense amplifier output detecting circuit 22' is composed of a pMOS transistor 27' whose channel width is narrower than that of the nMOS transistor, and a plurality of pairs of two nMOS transistors $T_0, T_1, \ldots, T_n$, and a nMOS transistor 30'.

Here, the source of the pMOS transistor 27' is connected to a supply voltage Vcc, and the gate thereof is grounded, so that this pMOS transistor 27' is always kept turned on. Further, each pair of two nMOS transistors $T_0, T_1, \ldots, T_n$ is composed of an nMOS transistor 28' and an nMOS transistor 29'. The drain of the nMOS transistor 28' is connected to the drain of the pMOS transistor 27' (this junction point is the output of the sense amplifier output detecting circuit 22), and the gate thereof is connected to the output O of the gate circuit 21. The drain of the nMOS transistor 29' is connected to the source of the nMOS transistor 28', and the gate thereof is connected to the output /O of the gate circuit 21. Further, the same outputs O and /O of the same gate circuit 21 are inputted to the gates of each of a plurality of pairs of the nMOS transistors 28' and 29'. Further, the drain of the nMOS transistor 30' is connected to the source of the nMOS transistor 29', and the sense amplifier activating signal ACT is inputted to the gate of the nMOS transistor 30'.

In the circuit configuration as described above, the sense amplifier activating signal ACT becomes on, only when all the sense amplifiers 14 of the same memory cell block outputs memory data. Accordingly, it is possible to provide the semiconductor memory device free from the erroneous operation, in case the access time disperses due to the influence of fluctuations during the manufacturing process.

A fourth embodiment of the present invention will be described hereinbelow. In this embodiment, the sense amplifier activating signal ACT is used not only to control the sense amplifier 14 but also to control the word lines.

Figure 10:
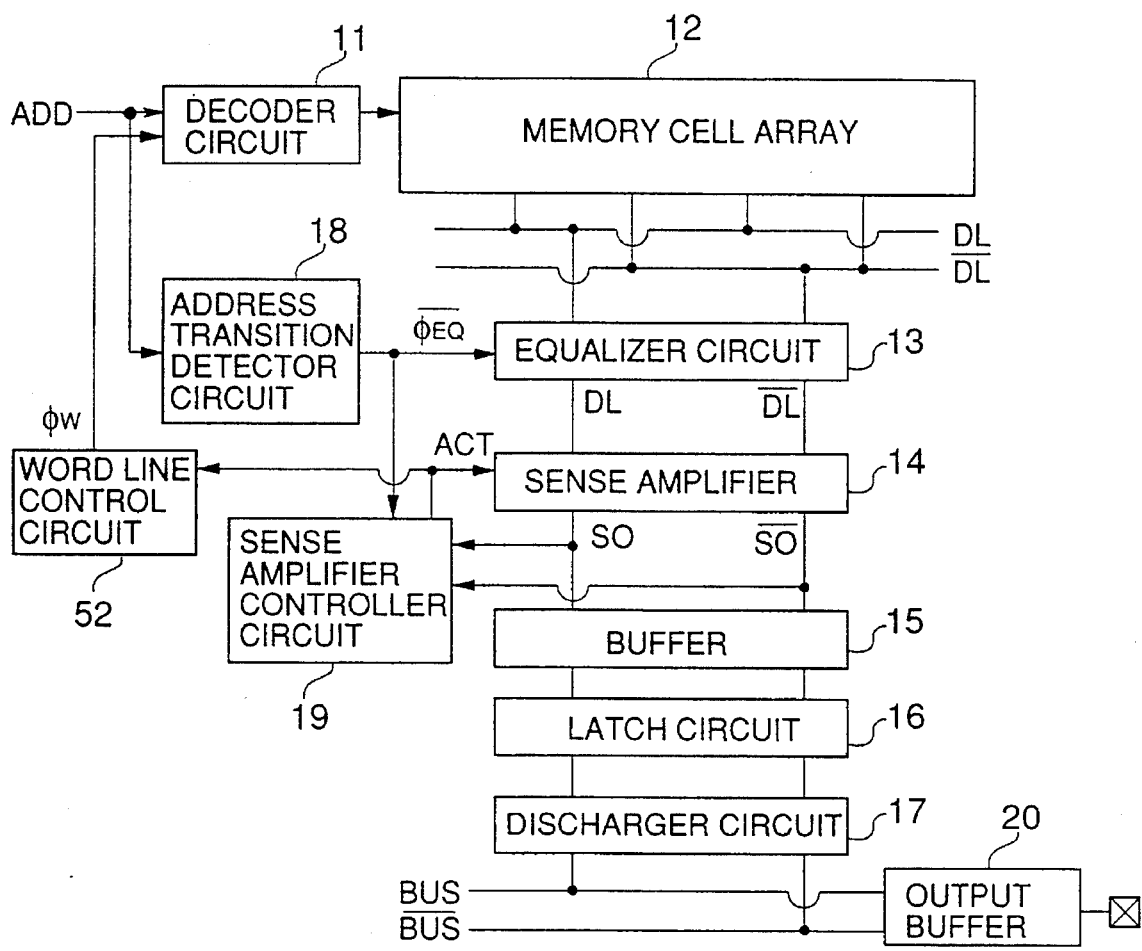
FIG. 10 is a schematic block diagram showing a fourth embodiment of the semiconductor memory device according to the present invention.

FIG. 10 is a schematic block diagram showing the semiconductor memory device related to this embodiment, in which the same reference numerals have been retained for the similar elements which have the same function as with the case of the first embodiment shown in FIG. 3 without repeating the description thereof.

A word line control circuit 52 which is different from the first embodiment receives the sense amplifier activating signal ACT supplied from the sense amplifier control circuit 19. When this activating signal ACT is off or non-active, this word line control circuit 52 turns off a word line control signal $\Phi_W$ applied to the decode circuit 11. When this the word line control signal $\Phi_W$ is turned off, the decode circuit 11 turns off all the word lines (not shown) in the memory cell array 12, irrespective of the contents of the address signal Add.

Therefore, immediately after memory data has been outputted from the outputs SO and /SO of the sense amplifier 14, the word lines are turned off to deactivate the corresponding memory cell.

As described above, in the semiconductor memory device according to the present invention, it is possible to reduce not only the consumed current Ia of the sense amplifier 14 but also the steady state current of the memory cell, thus allowing the current consumption of the semiconductor memory cell to be reduced markedly.

In addition, it is possible to prevent the erroneous operation in data read, in case cell access time disperses due to fluctuations during the manufacturing process.

What is claimed is:

1. A semiconductor memory device comprising:
   a memory cell array having a plurality of word lines for accessing data stored within the memory cell array;
   a plurality of address lines coupled to the memory cell array so as to designate a memory cell within the memory cell array;
   a pair of data lines coupled to the memory cell within the memory cell array for acquiring complementary data from the memory cell;
   an address transition detector circuit coupled to the address lines to output an address transition signal in response to a change in a signal on the address lines;
   an equalizer circuit coupled to the pair of data lines and responsive to the address transition signal to establish a signal having the same predetermined value on each of the pair of data lines;
   a sense amplifier coupled to the pair of data lines for generating a sense amplifier output signal in response to a change in potential on the pair of the data lines;
   a sense amplifier control circuit coupled to the address transition detector circuit and coupled to the sense amplifier, the sense amplifier control circuit activating the sense amplifier in response to the address transition signal and deactivating the sense amplifier in response to the sense amplifier output signal; and
   a word line control circuit coupled to the sense amplifier control circuit and to the memory cell array, wherein the word line control circuit deactivates the word lines within the memory cell array in response to the sense amplifier control circuit.

2. The semiconductor memory device of claim 1 further comprising a decoder coupled to the address lines and to the word line control circuit, wherein the word line control circuit causes the decoder to disable the word lines in response to a signal generated by the sense amplifier control circuit.

3. The semiconductor memory device of claim 1 wherein the sense amplifier output signal comprises a pair of digital signals and wherein one of the digital signals becomes the logical complement of the other of the digital signals when data are present on the pair of data lines when the sense amplifier is activated and wherein the one of the digital signals becomes the same as the other of the digital signals when the sense amplifier is deactivated.

4. The semiconductor memory device of claim 3 wherein the sense amplifier control circuit deactivates the sense amplifier in response to one of the digital signals becoming different from the other of the digital signals.

5. The semiconductor memory device of claim 1 wherein the sense amplifier control circuit generates a sense amplifier control signal in response to the address transition signal and the sense amplifier output signal, wherein one value of the sense amplifier control signal activates the sense amplifier and wherein a second value of the sense amplifier control signal deactivates the sense amplifier.

6. The semiconductor memory device of claim 5 wherein the second value of the sense amplifier control signal causes the word line control circuit to deactivate the word lines in the memory cell array.

7. A semiconductor memory device comprising:
   a memory cell array having a plurality of word lines for accessing data stored within the memory cell array;
   a plurality of address lines coupled to the memory cell array so as to designate a memory cell within the memory cell array;
   a pair of data lines coupled to the memory cell within the memory cell array for acquiring complementary data from the memory cell;
   an address transition detector circuit coupled to the address lines to output an address transition signal in response to a change in a signal on the address lines;
   a sense amplifier coupled to the pair of data lines for generating a sense amplifier output signal in response to a change in potential on the pair of the data lines;
   a sense amplifier control circuit coupled to the address transition detector circuit and coupled to the sense amplifier to provide a control signal to the sense amplifier and to receive the sense amplifier output signal, the sense amplifier control circuit activating the sense amplifier in response to the address transition signal and deactivating the sense amplifier in response to the sense amplifier output signal; and
   a word line control circuit coupled to the sense amplifier control circuit and to the memory cell array, wherein the word line control circuit deactivates the word lines within the memory cell array in response to the sense amplifier control circuit.

\* \* \* \* \*